United States Patent [19]

Hongu et al.

[11] 4,234,963
[45] Nov. 18, 1980

[54] SYNCHRONOUS DETECTOR PARTICULARLY ADAPTED FOR A VIDEO IF SIGNAL

[75] Inventors: Masayuki Hongu, Kawasaki; Hiromi Kawakami, Yokohama; Masaharu Tokuhara, Tokyo, all of Japan

[73] Assignee: Sony Corporation, Tokyo, Japan

[21] Appl. No.: 906,406

[22] Filed: May 16, 1978

[30] Foreign Application Priority Data

May 19, 1977 [JP] Japan .............................. 52-64105[U]

[51] Int. Cl.³ .......................... H04B 1/30; H04B 1/66
[52] U.S. Cl. .................................... 455/204; 358/188; 455/201
[58] Field of Search ................... 358/23, 39, 148, 158, 358/188; 329/50, 153, 101, 134, 103, 133, 138; 325/50, 328, 330, 331; 307/237

[56] References Cited

U.S. PATENT DOCUMENTS

| 3,573,497 | 6/1971 | Kraybill | 325/347 |
| 3,796,963 | 3/1974 | Balaban | 325/328 X |
| 3,921,073 | 11/1975 | Pexa | 325/331 X |

*Primary Examiner*—Benedict V. Safourek
*Attorney, Agent, or Firm*—Lewis H. Eslinger; Alvin Sinderbrand

[57] ABSTRACT

A synchronous detector adapted to detect a modulated information signal, such as a video IF signal. The modulated information signal is provided in the form of a vestigial sideband signal. A band-pass filter including a tuned circuit tuned to the frequency of the carrier on which the information signal is modulated has a pass band which is less than the frequency spectrum of the vestigial sideband signal so as to limit the frequency spectrum of the signal passed by the filter to a double sideband signal. A limiter is coupled to the band-pass filter to receive the double sideband signal and for deriving a switching carrier therefrom, the frequency of the switching carrier being equal to the frequency of the carrier on which the information signal is modulated. An emitter-follower circuit is connected between the band-pass filter and the limiter so as to couple the double sideband signal from the filter to the limiter. A multiplier circuit has first input terminals coupled to the limiter for receiving the derived switching carrier and second input terminals for receiving the modulated information signal, whereby the modulated information signal is multiplied with the switching carrier to obtain the information signal.

7 Claims, 4 Drawing Figures

SYNCHRONOUS DETECTOR PARTICULARLY ADAPTED FOR A VIDEO IF SIGNAL

BACKGROUND OF THE INVENTION

This invention relates to a synchronous detector circuit and, more particularly, to a synchronous detector circuit which is capable of detecting the video information signal which is provided at the output of the video IF stage in a television receiver.

In a television receiver, the received composite television signal is converted into an intermediate frequency (IF) signal. Since the television signal is transmitted as a vestigial sideband signal, the IF signal includes a video signal component modulated onto a video IF carrier, a chrominance component modulated onto an IF chrominance subcarrier and a sound component modulated onto an IF sound carrier. The video signal, which includes the luminance component and the horizontal synchronizing signal, is amplitude-modulated onto the IF video carrier; and the sound signal is frequency-modulated onto the IF sound carrier. Typically, in the IF stage of a television receiver, the IF amplifier is adjusted to limit application of the modulated sound frequencies, but to provide a higher gain for the video IF carrier and, thus, a higher gain for some of the video IF sidebands. This has the effect of substantially attenuating the sound component, whereby a relatively simple detector circuit, such as a diode detector, can be used to demodulate the IF video signal.

However, because of the low efficiency of a diode detector, and because of unwanted intermodulation products in the IF frequency band, alternative video detector circuits have been proposed. One type of detector which has been considered for use in a television receiver is the synchronous detector. A synchronous detector generally is a multiplier circuit which multiplies an amplitude-modulated signal with the carrier of the amplitude-modulated signal. The product of this multiplication is the information signal which had been used to amplitude-modulate the carrier. If the carrier which is supplied to the synchronous detector is in exact phase with the amplitude-modulated signal, a highly accurate demodulation operation is achieved.

Synchronous detectors have been used satisfactorily at relatively low frequencies. For example, the relatively low IF frequencies in radio reception lend themselves to accurate detection of the modulating signal. However, synchronous detectors heretofore have offered less than satisfactory results when used to detect a video IF signal.

In one type of synchronous video detector, the carrier, also known as the switching carrier, which is multiplied with the IF signal is derived from the IF signal by passing the output of, for example, the video IF amplifier through a limiter and a bandpass filter so as to recover essentially only the IF carrier. This recovered IF carrier then is multiplied with the video IF signal produced by the video IF amplifier. Since the video IF signal is a vestigial sideband signal, various sideband components, including the IF chrominance subcarrier and the IF sound carrier combine with the IF video carrier to vary the phase thereof. The limiter, which is connected ahead, or upstream of the band-pass filter, generally cannot remove these interfering components. Consequently, the phase of the derived switching carrier is not stable. Furthermore, unpredictable phase modulations in this switching carrier are a function of the amplitude modulations on the IF video carrier. Thus, there is an unstable, changing phase relation between the IF video signal and the switching carrier which is derived therefrom. Because of this changing phase relation, synchronous detection of the video signal is difficult, and the original video signal often cannot be recovered with high fidelity.

In one type of synchronous video detector, such as described in U.S. Pat. No. 3,697,685, the limiter and bandpass filter are combined into a single circuit. The limiter is formed as a differential amplifier having a pair of output terminals. A tuned LC circuit is connected across the differential amplifier output terminals, and a pair of parallel-connected, oppositely-poled diodes also are connected across these output terminals. Although this circuit is of a relatively simple configuration and can be fabricated as an integrated circuit, it suffers from the same disadvantage as described above. That is, the phase of the derived switching carrier varies with amplitude modulations in the IF video signal primarily because of the inability of the limiter to suppress various IF sideband components sufficiently. Furthermore, in this type of limiter-filter combination, the Q of the bandpass filter is relatively low. This reduces the efficiency of the limiter-filter combination in deriving the switching carrier. Amplitude detection of the video signal is not achieved with high fidelity, resulting in some degradation of the ultimately reproduced video picture.

OBJECTS OF THE INVENTION

Therefore, it is an object of the present invention to provide an improved synchronous detector of a type which is adapted for use as a video detector in the IF stage of a television receiver.

Another object of this invention is to provide a synchronous detector for use in the IF stage of a television receiver wherein a switching carrier is derived with stable phase and with substantially suppressed amplitude modulation components.

A further object of this invention is to provide an improved synchronous detector which is useful in deriving a switching carrier from a video IF signal so that the switching carrier can be multiplied with the video IF signal so as to produce the video information signal.

Another object of this invention is to provide an improved synchronous video detector of relatively simple circuit configuration.

Yet another object of this invention is to provide an improved synchronous video detector having a bandpass filter for deriving a switching carrier from the video IF signal, the band-pass filter having a relatively high Q.

Yet a further object of this invention is to provide an improved synchronous video detector including a limiter circuit which suppresses amplitude modulation components of the IF carrier, the limiter circuit advantageously being formed as a differential amplifier.

Various other objects, advantages and features of the present invention will become readily apparent from the ensuing detailed description, and the novel features will be particularly pointed out in the appended claims.

SUMMARY OF THE INVENTION

In accordance with this invention, a synchronous detector is provided which is adapted to detect a video IF signal. The synchronous detector includes a bandpass filter including a tuned circuit which is tuned to the frequency of the carrier, such as the IF carrier, on which the information signal, such as the video signal, is modulated, the band-pass filter having a pass band less than the frequency spectrum of the IF signal. If the IF signal is a vestigial sideband signal, the limited pass band of the band-pass filter limits the spectrum of the signal passed thereby to a double sideband signal. A limiter is coupled to the output of the band-pass filter by an emitter-follower circuit so as to receive the double sideband signal passed by the filter and thereby derive a switching carrier therefrom. The frequency of the switching carrier derived by the limiter is equal to the frequency of the carrier, such as the IF carrier, on which the information signal, such as the video signal, is modulated. A multiplier circuit receives the modulated information signal, such as the video IF signal, and also is coupled to the limiter so as to receive the derived switching carrier. The multiplier circuit multiplies the modulated information signal with the switching carrier to obtain the information signal, such as the original video signal.

BRIEF DESCRIPTION OF THE DRAWINGS

The following detailed description, given by way of example, will best be understood in conjunction with the accompanying drawings in which.

DETAILED DESCRIPTION OF A PREFERRED EMBODIMENT

Figure 1:
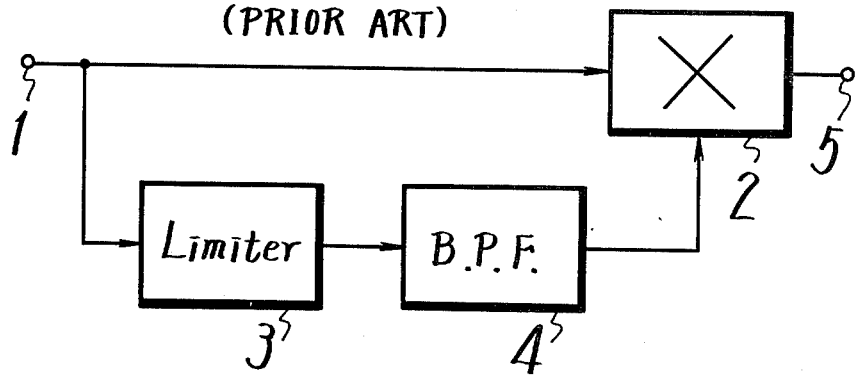
FIG. 1 is a block diagram of a previously proposed synchronous video detector.

In order to best appreciate the advantages and beneficial results achieved by the present invention, reference is made initially to a previously proposed synchronous detector arrangement for use in a television receiver. FIG. 1 is a block diagram of such a synchronous detector arrangement, and includes an input terminal 1, a multiplier circuit 2, a limiter 3 and a band-pass filter 4. Input terminal 1 is connected to the output of a video IF amplifier and is supplied with the usual IF vestigial sideband signal. Input terminal 1 is connected directly to one input of multiplier circuit 2 and, through limiter 3 and band-pass filter 4, connected in cascade, to another input of the multiplier circuit. The combination of limiter 3 and band-pass filter 4 derives a switching carrier from the video IF signal, the frequency of the switching carrier being equal to the IF carrier. The output of multiplier circuit 2 is connected to an output terminal 5 whereat a detected video signal is provided.

In operation, the IF video signal supplied to input terminal 1 is a vestigial sideband signal. Accordingly, this vestigial sideband signal includes one sideband component of the amplitude-modulated video signal, together with the IF chrominance subcarrier and the IF sound carrier. In general, limiter circuit 3 does not eliminate the unwanted sideband components. Nevertheless, it does function to attenuate components such as the IF sound carrier, and to increase the gain of other portions of the IF sideband. Band-pass filter 4 is tuned to the IF carrier frequency so as to derive the switching carrier from the IF carrier supplied thereto by the limiter.

Portions of the IF sideband which cannot be eliminated by the limiter circuit affect the phase of the derived switching carrier. Furthermore, because of the presence of these sideband components, the phase of the IF carrier, and thus the derived switching carrier, may vary as a function of the amplitude modulations of the video IF signal. Consequently, in the arrangement shown in FIG. 1, the phase of the switching carrier which is supplied to multiplier circuit 2 by the combination of limiter 3 and band-pass filter 4 will not be stable. If the phase of the switching carrier varies with respect to the phase of the video IF signal supplied to the multiplier circuit by input terminal 1, an accurate synchronous detection operation will not be achieved. That is, for proper operation of a synchronous detector circuit, it is necessary that a constant phase relation be maintained between the modulated signal and the derived switching carrier. The arrangement shown in FIG. 1 does not attain such a stable phase relation. Thus, the video signal supplied to output terminal 5 by multiplier circuit 2 may not be an accurate reproduction of the original video signal. That is, synchronous detection is not attained with high fidelity.

Figure 2:
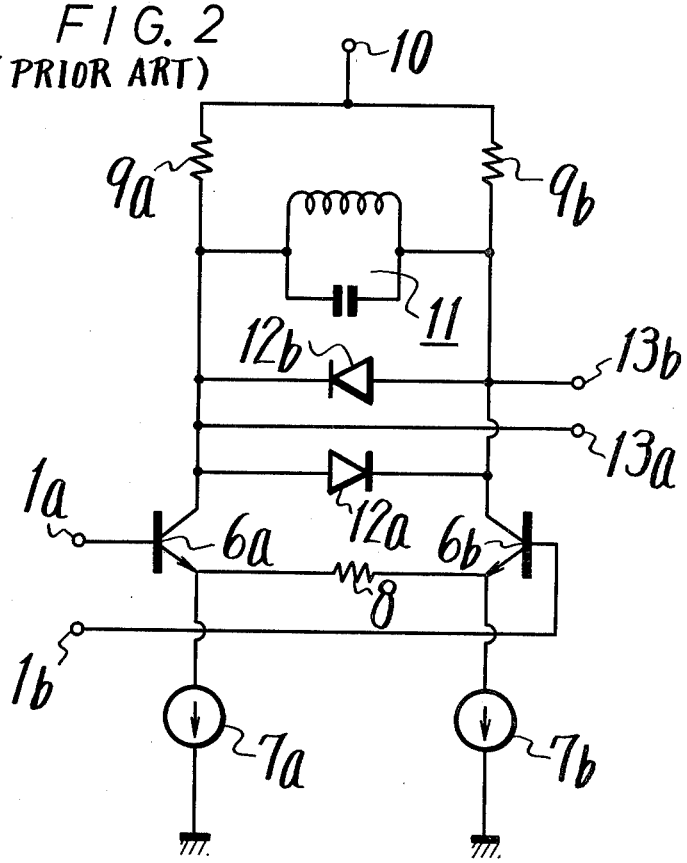
FIG. 2 is a schematic diagram of one embodiment of the circuit which can be used in FIG. 1 to derive a switching carrier for synchronous detection.

FIG. 2 is a schematic diagram of one proposal for a modified limiter-filter arrangement. Limiter 3 of FIG. 1 is shown herein as a differential amplifier formed of differentially-connected npn transistors 6a and 6b whose base electrodes are connected to input terminals 1a and 1b, respectively, for receiving a differentially-supplied IF video signal. Band-pass filter 4 is shown in FIG. 2 as a parallel-connected LC tuned circuit 11. This tuned circuit is connected across the output terminals of the differential amplifier and, more particularly, across the collector electrodes of transistors 6a and 6b, these electrodes being connected to output terminals 13a and 13b, respectively. The emitter electrodes of the differentially-connected transistors are coupled to constant current sources 7a and 7b, respectively, and a resistor 8 interconnects these emitter electrodes. Collector load resistors 9a and 9b couple the collector electrodes of transistors 6a and 6b, respectively, to a source of operating voltage 10. Oppositely poled diodes 12a and 12b are connected in parallel with tuned circuit 11 across the collector electrodes of the differentially-connected transistors. These diodes serve to limit the voltage swing across the transistors.

In operation, the video IF signal is applied differentially to input terminals 1a and 1b. The differential amplifier formed of transistors 6a and 6b amplifies the supplied IF video signal, and tuned circuit 11 is tuned to the IF carrier. Accordingly, output terminals 13a and 13b are provided differentially with the derived switching carrier whose frequency is equal to the IF carrier frequency. While the illustrated circuit in FIG. 2 is of relatively simple construction and can be fabricated as an integrated circuit, it suffers from substantially the same disadvantages discussed hereinabove with respect to FIG. 1. That is, because of the presence of IF sideband components in the limiter circuit, video amplitude modulations results in a changing phase in the derived switching carrier at output terminals 13a and 13b. As a further disadvantage of the illustrated circuit, the limiting effect of diodes 12a and 12b reduces the Q of tuned circuit 11. As a consequence thereof, the efficiency with which the illustrated circuit derives the switching carrier is diminished. Thus, even when the circuit shown in FIG. 2 is used as the limiter-filter arrangement in the synchronous detector shown in FIG. 1, the video signal still is not reproduced with high fidelity.

Figure 3:
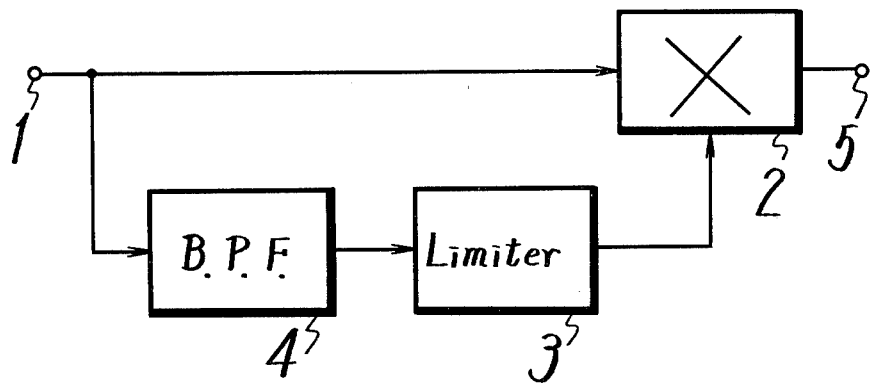
FIG. 3 is a block diagram of a synchronous video detector in accordance with the present invention.

The aforenoted disadvantages inherent in the circuits shown in FIGS. 1 and 2 are avoided by the embodiment shown in FIG. 3. The block diagram of FIG. 3 differs from the block diagram of FIG. 1 in that the respective locations of band-pass filter 4 and limiter 3 are interchanged. Thus, in the FIG. 3 embodiment, and in accordance with an aspect of the present invention, the amplitude modulated video IF signal is supplied from input terminal 1 to band-pass filter 4 so that the filter functions to substantially suppress the sideband components in the IF signal. More particularly, the pass band characteristic of band-pass filter 4 is such that most of the sideband is attenuated, whereby the filter passes a relatively small portion of the sideband together with the vestigial sideband. Thus, bandpass filter 4 serves to pass a double sideband signal which, in one example, may be thought of as being centered on the IF carrier. One of the double sidebands is the vestigial sideband and the other of the double sidebands is that portion of the IF single sideband which is not suppressed by the bandpass filter. Of course, the vestigial sideband lies on one side of the IF carrier and the unsuppressed, or passed sideband, lies on the other side of the IF carrier.

In view of the pass band characteristic of band-pass filter 4, limiter circuit 3 is provided with a double sideband signal, including the IF carrier component. The double sidebands do not vary or modulate the phase of the IF carrier in limiter circuit 3. Consequently, limiter circuit 3 derives the switching carrier with stabilized phase. This means that the phase of the derived switching carrier is equal to the phase of the video IF signal. Therefore, since a constant, stable phase relation is maintained between the amplitude modulated signal and the switching carrier, both of which are supplied to multiplier circuit 2, the video signal is detected with high fidelity. The multiplier circuit thus supplies an accurate version of the original video signal to output terminal 5.

Figure 4:
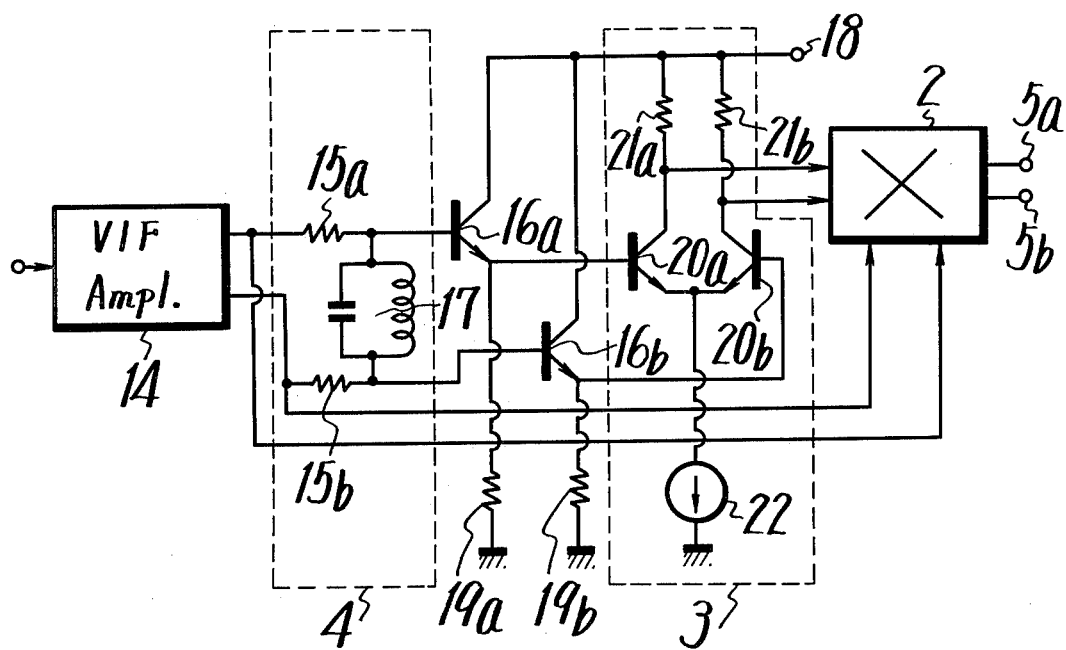
FIG. 4 is a schematic diagram of the circuitry which is used to derive the switching carrier for synchronous detection, in accordance with this invention.

A circuit embodiment of the filter-limiter arrangement shown in FIG. 3 is schematically illustrated in FIG. 4. In FIG. 4, input terminal 1 is replaced by a video IF amplifier 14 provided with a pair of output terminals to which the video IF signal is differentially supplied. Band-pass filter 4 is comprised of a parallel-connected LC tuned circuit 17, this circuit being connected across the pair of output terminals of video IF amplifier 14. More particularly, resistors 15a and 15b connect the pair of output terminals of amplifier 14 to LC circuit 17.

Limiter circuit 3 is shown in FIG. 4 as a differential amplifier comprised of a pair of differentially-connected transistors 20a and 20b whose emitter electrodes are connected in common to ground through a constant current source 22. The base electrodes of transistors 20a and 20b are adapted to receive the filtered video IF signal which is differentially applied thereacross. The collector electrodes of transistors 20a and 20b are coupled via collector load resistors 21a and 21b, respectively, to a source of operating potential 18. In addition, these collector electrodes serve as the pair of output terminals of the limiter circuit and, as shown, are connected to a pair of input terminals of multiplier circuit 2.

Parallel-connected LC circuit 17 is connected to the base electrodes of differentially-connected transistors 20a and 20b via emitter-follower transistors 16a and 16b, respectively, the emitter electrodes of which being connected to ground via emitter resistors 19a and 19b, respectively.

The pair of output terminals of video IF amplifier 14 additionally are connected to a corresponding pair of input terminals of multiplier circuit 2. The output of the multiplier circuit is differentially provided across output terminals 5a and 5b.

The frequency to which LC circuit 17 is tuned is equal to the IF carrier frequency. The passband of this tuned LC circuit is seen to be substantially less than the frequency spectrum of the IF video signal, that is, the frequency spectrum of the vestigial sideband IF signal. As a consequence of this limited passband, tuned LC circuit 17 passes the IF carrier, the vestigial sideband component and a relatively small portion of the main IF sideband component. The frequency spectrum of the passed IF signals appears as a double sideband IF signal, including the IF carrier.

The use of emitter-follower transistors 16a and 16b provides buffer isolation between tuned LC circuit 17 and the differential amplifier which functions as the limiter circuit. Because of this buffer isolation, the Q of the band-pass filter can be made relatively high. It is this high Q which limits the passband characteristic of the tuned circuit, and thus enables substantial suppression of the unwanted components of the output of video IF amplifier 14. Furthermore, by supplying a double sideband signal differentially to the differential amplifier, the IF carrier, which also is supplied thereto, is not phase modulated. This means that amplitude fluctuations, or modulations, of the video IF signal do not modulate the phase of the IF carrier. Therefore, the limiter circuit formed of differentially-connected transistors 20a and 20b is enabled to derive the switching carrier with stable phase. This phase-stabilized switching carrier is supplied to one pair of inputs of multiplier circuit 2 while the video IF signal is supplied to the other pair of inputs of the multiplier circuit. Hence, the derived switching carrier is multiplied with the video IF signal, resulting in the video signal component applied differentially across output terminals 5a and 5b. In view of the stable phase of the derived switching carrier, this video signal is a highly accurate version of the original video signal.

Since the limiter circuit, formed of differentially-connected transistors 20a and 20b, together with emitter-follower transistors 16a and 16b can be fabricated as an integrated circuit, it is appreciated that the circuit construction of the embodiment shown in FIG. 4 is greatly simplified.

While the present invention has been particularly shown and described with reference to a preferred embodiment thereof, it will be readily apparent to those of ordinary skill in the art that various changes and modifications in form and details can be made without departing from the spirit and scope of the invention. For example, the illustrated synchronous detector circuit need not be limited solely for application in a television receiver. Other types of information signals modulated onto a relatively higher frequency carrier can be synchronously detected by the disclosed invention. Advantageously, if the modulated information signal is a vestigial sideband signal, then the particular passband characteristic of the illustrated band-pass filter, taken in combination with the illustrated limiter circuit, avoids undesired phase modulation of the derived switching carrier due to amplitude modulations of the information signal. Furthermore, unwanted sideband components are effectively, and greatly suppressed by the illustrated circuitry. It is intended that the appended claims be interpreted as including the foregoing as well as obvious changes and modifications.

What is claimed is:

1. A synchronous detector adapted to detect an information signal modulated onto a carrier, such as a video IF signal, comprising:

means for supplying said modulated information signal in the form of a vestigial sideband signal having a broad bandwidth sideband on a first side of said carrier and a vestigial sideband on a second side of said carrier;

filter means coupled to said means for supplying, said filter means including a tuned circuit having a center frequency substantially equal to the frequency of the carrier on which said information signal is modulated and having a passband which passes said vestigial sideband and which also passes only a portion of said broad bandwidth sideband having a band of frequencies substantially equal to the band of frequencies of said vestigial sideband for limiting the spectrum of the signal passed thereby to a double sideband signal having a bandwidth substantially equal to twice said vestigial sideband;

a differential amplifier having first and second inputs for differentially receiving the double sideband signal passed by said filter means, said differential amplifier being effective to limit said double sideband signal and to thereby derive a switching carrier therefrom, the frequency of said switching carrier being equal to the frequency of the carrier on which said information signal is modulated;

emitter-follower means connected between said filter means and said limiter means for coupling said double sideband signal from said filter means to said limiter means; and multiplier means having first and second input terminals coupled to said limiter means and to said means for supplying, respectively, for multiplying said modulated information signal with said switching carrier to obtain said information signal.

2. The detector of claim 1 wherein said means for supplying comprises a video IF amplifier of a television receiver; said modulated information signal comprising a video IF signal; and said carrier on which said information signal is modulated comprising the IF carrier.

3. The detector of claim 2 wherein said video IF amplifier has a pair of outputs to which said video IF signal is applied differentially, and said tuned circuit is connected across said pair of outputs.

4. The detector of claim 3 wherein said emitter-follower means comprises a pair of emitter-follower transistors having their respective base electrodes connected across said tuned circuit and having their respective emitter electrodes connected to the first and second inputs of said differential amplifier.

5. The detector of claim 4 wherein said differential amplifier is comprised of a pair of differentially-connected transistors; and wherein said first input of said multiplier means comprises a first pair of input terminals coupled to the respective collector electrodes of said pair of differentially-connected transistors, and said second input terminals of said multiplier means comprises a second pair of input terminals coupled to said pair of outputs of said video IF amplifier.

6. The detector of claim 5 wherein said tuned circuit comprises a parallel LC circuit.

7. The detector of claim 6 wherein said emitter-follower transistors and said differentially-connected transistors are fabricated as an integrated circuit.

* * * * *